United States Patent
Han et al.

(10) Patent No.: US 12,071,690 B2
(45) Date of Patent: Aug. 27, 2024

(54) THIN FILM STRUCTURE INCLUDING DIELECTRIC MATERIAL LAYER, AND METHOD OF MANUFACTURING THE SAME, AND ELECTRONIC DEVICE EMPLOYING THE SAME

(71) Applicant: Samsung Electronics Co., Ltd., Suwon-si (KR)

(72) Inventors: Narae Han, Suwon-si (KR); Jeonggyu Song, Seongnam-si (KR); Yongsung Kim, Suwon-si (KR); Jooho Lee, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 618 days.

(21) Appl. No.: 16/827,895

(22) Filed: Mar. 24, 2020

(65) Prior Publication Data
US 2021/0140049 A1    May 13, 2021

(30) Foreign Application Priority Data
Nov. 12, 2019 (KR) .................. 10-2019-0144530

(51) Int. Cl.
*C23C 16/56* (2006.01)
*C01F 7/02* (2022.01)
(Continued)

(52) U.S. Cl.
CPC ............. *C23C 16/56* (2013.01); *C01F 7/02* (2013.01); *C01G 15/00* (2013.01); *C01G 25/02* (2013.01);
(Continued)

(58) Field of Classification Search
None
See application file for complete search history.

(56) References Cited

U.S. PATENT DOCUMENTS 9,064,802 B2   6/2015  Watanabe
2003/0207473 A1  11/2003  Li et al.
(Continued)

FOREIGN PATENT DOCUMENTS

| JP | 2008-306036 A | 12/2008 |
| KR | 10-2019-0062031 A | 6/2019 |
| WO | WO-2016-031986 A1 | 3/2016 |

OTHER PUBLICATIONS

Sheng (ACS Appl. Mater. Interfaces 2016, 8, 33821-33828) (Year: 2016).*

(Continued)

*Primary Examiner* — Austin Murata
(74) *Attorney, Agent, or Firm* — Harness, Dickey & Pierce, P.L.C.

(57) ABSTRACT

A thin film structure including a dielectric material layer, a method of manufacturing the same, and an electronic device employing the same are disclosed. The disclosed thin film structure includes a first conductive layer; a first dielectric material layer on the first conductive layer, the first dielectric material layer having a crystal phase and including a metal oxide; an $In_xO_y$-based seed material layer formed on the first dielectric material layer and having a thickness less than a thickness of the first dielectric material layer; and a second conductive layer formed on the seed material layer.

19 Claims, 6 Drawing Sheets

(51) Int. Cl.
| | |
|---|---|
| C01G 15/00 | (2006.01) |
| C01G 25/02 | (2006.01) |
| C01G 27/02 | (2006.01) |
| C23C 14/08 | (2006.01) |
| C23C 14/58 | (2006.01) |
| C23C 16/40 | (2006.01) |
| C23C 16/455 | (2006.01) |
| H10B 12/00 | (2023.01) |
| H10B 53/00 | (2023.01) |

(52) U.S. Cl.
CPC .............. *C01G 27/02* (2013.01); *C23C 14/08* (2013.01); *C23C 14/081* (2013.01); *C23C 14/5806* (2013.01); *C23C 16/40* (2013.01); *C23C 16/403* (2013.01); *C23C 16/45525* (2013.01); *H10B 12/00* (2023.02); *H10B 53/00* (2023.02); *C01P 2006/40* (2013.01)

(56) References Cited

U.S. PATENT DOCUMENTS

| | | | |
|---|---|---|---|
| 2008/0203529 A1* | 8/2008 | Kang | ............... H01L 28/40 257/532 |
| 2015/0194234 A1 | 7/2015 | Shin et al. | |
| 2019/0165088 A1 | 5/2019 | Cho et al. | |
| 2020/0335333 A1* | 10/2020 | Kang | ............... H01L 28/40 |

OTHER PUBLICATIONS

Muller (Nano Lett. 2012, 12, 8, 4318-4323). (Year: 2012).*

Young je Jo et al., "Characteristics of Transparent Mim Capacitor using Hfo2 System for Transparent Electronic Device," Applied Science and Convergence Technology, vol. 18(1), pp. 30-36, Jan. 2009.

David Vanderbilt et al., "Structural and dielectric properties of crystalline and amorphous ZrO2," Thin Solid Films, vol. 486, pp. 125-128, 2005.

T. S. Böscke et al., "Tetragonal Phase Stabilization by Doping as an Enabler of Thermally Stable HfO2 based MIM and MIS Capacitors for sub 50nm Deep Trench DRAM," IEEE: 2006 International Electron Devices Meeting, Dec. 11-13, 2006, San Francisco, CA, USA.

M. H. Park et al., "Study on the internal field and conduction mechanism of atomic layer deposited ferroelectric Hf0.5Zr0.5O2 thin films," Journal of Materials Chemistry C, pp. 6291-6300, vol. 3, 2015.

M. H. Park et al., "A comprehensive study on the structural evolution of HfO2 thin films doped with various dopants," Journal of Materials Chemistry C, pp. 4677-4690, Apr. 19, 2017.

* cited by examiner

THIN FILM STRUCTURE INCLUDING DIELECTRIC MATERIAL LAYER, AND METHOD OF MANUFACTURING THE SAME, AND ELECTRONIC DEVICE EMPLOYING THE SAME

CROSS-REFERENCE TO RELATED APPLICATION

This application claims the benefit of Korean Patent Application No. 10-2019-0144530, filed on Nov. 12, 2019, in the Korean Intellectual Property Office, the disclosure of which is incorporated herein in its entirety by reference.

BACKGROUND

1. Field

The inventive concepts relate to a thin film structure including a dielectric material layer, a method of manufacturing the same, and an electronic device including the same.

2. Description of Related Art

Recently, with the demand for the miniaturization and higher performance of electronic apparatuses, the demand for higher integration of semiconductor devices has increased.

As the degree of integration of the semiconductor devices increases, a design rule is reduced, and thus, spaces occupied by electronic devices such as a metal insulator metal (MIM) capacitor and a metal oxide semiconductor (MOS) transistor are rapidly reduced. Thus a dielectric material layer that has high permittivity characteristics even at a thin thickness overcoming the spatial limitations and having good operation characteristics would be beneficial.

SUMMARY

There is provided a thin film structure including a dielectric material layer having a thin thickness and high permittivity characteristics, a method of manufacturing the same, and an electronic device including the same.

Additional aspects will be set forth in part in the description which follows and, in part, will be apparent from the description, or may be learned by practice of the presented embodiments of the disclosure.

A thin film structure according to a first aspect includes a first conductive layer; a first dielectric material layer on the first conductive later, the first dielectric layer having a crystal phase and include a metal oxide; an indium oxide-based seed material layer on the first dielectric material layer, the seed material layer having a thickness less than a thickness of the first dielectric material layer; and a second conductive layer formed on the seed material layer.

The first dielectric material layer may comprise at least one of $HfO_2$, $ZrO_2$, and $Al_2O_3$.

The first dielectric material layer may be formed to have a thickness less than or equal to approximately 5 nm.

The first dielectric material layer may comprise a tetragonal crystal phase.

The first dielectric material layer may have paraelectric characteristics.

The thin film structure may further include a second dielectric material layer which includes a metal oxide including a component different from a component of the first dielectric material layer between the first conductive layer and the first dielectric material layer and configured to promote crystallization of the first dielectric material layer.

The first dielectric material layer may comprise at least one of $HfO_2$, $ZrO_2$, and $Al_2O_3$, and the second dielectric material layer may include a metal oxide including a component different from a component of the first dielectric material layer among the at least one of $HfO_2$, $ZrO_2$, and $Al_2O_3$.

The seed material layer may include at least one of indium tin oxide (ITO) and indium zinc oxide (IZO).

The seed material layer may have a thickness less than or equal to approximately 1 nm.

A method of manufacturing a thin film structure according to a second aspect includes preparing a base layer; forming a first conductive layer on the base layer; forming a first dielectric material layer on the first conductive layer, the first dielectric material layer comprising a metal oxide; forming an indium oxide-based seed material layer on the first dielectric material layer, the seed material layer having a first thickness; heat treating the first dielectric material layer after forming the seed material layer; and forming a second conductive layer on the seed material layer after the heat treating.

The method of manufacturing the thin film structure may further including removing a partial thickness of the seed material layer after the heat treating such that the seed material layer has a second thickness less than the first thickness before forming the second conductive layer.

The second thickness of the seed material layer may be less than or equal to approximately 1 nm.

The method of manufacturing the thin film structure may further includes forming a second dielectric material layer on the first conductive layer, the second dielectric material layer comprising a metal oxide, the metal oxide including a component different from a component of the first dielectric material layer, and configured to promote crystallization of the first dielectric material layer before the forming the first dielectric material layer; and the first dielectric material layer may be formed on the second dielectric material layer.

The first dielectric material layer may include at least one of $HfO_2$, $ZrO_2$, and $Al_2O_3$, and the second dielectric material layer may include a metal oxide including a component different from a component of the first dielectric material layer among the at least one of the $HfO_2$, the $ZrO_2$, and the $Al_2O_3$.

The first dielectric material layer may include at least one of $HfO_2$, $ZrO_2$, and $Al_2O_3$.

The first dielectric material layer may be formed to have a thickness less than or equal to approximately 5 nm.

The first dielectric material layer may comprise tetragonal crystal phase.

The first dielectric material layer may have paraelectric characteristics.

The seed material layer may include at least one of ITO and IZO.

An electronic device according to a third aspect includes a base layer; and a thin film structure on the base layer.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Hereinafter, example embodiments will be described in detail with reference to the accompanying drawings. In the drawings, like reference numerals refer to like elements, and a size of each element in the drawings may be exaggerated for clarity and convenience of description. The embodiments to be described below are merely examples, and various modifications are possible from the embodiments.

Hereinafter, what is described as "over" or "on" may include not only directly over and in contact but also over without being in contact. The terms "first", "second", and the like may be used to describe various configuration elements but are only used to distinguish one configuration element from another configuration element. These terms do not limit the materials or structures of the configuration elements. A singular expression includes plural expressions unless the context clearly indicates otherwise. In addition, when a part is described to "include" a certain configuration element, which means that the part may further include other configuration elements, except to exclude other configuration elements unless otherwise stated. A term "above-described" and similar terminology may be used for the singular and the plural. When the terms "approximately" or "substantially" are used in this specification in connection with a numerical value, it is intended that the associated numerical value include a tolerance of ±10% around the stated numerical value. When ranges are specified, the range includes all values therebetween such as increments of 0.1%.

When an electric field is applied to a dielectric material, a dielectric polarization phenomenon occurs in which polarized molecules are aligned. The degree of polarization is proportional to the electric field. The degree to which the degree of dielectric polarization is proportional to the applied electric field may be expressed as permittivity. Permittivity ($\epsilon$) of the dielectric material may be expressed as relative permittivity ($\epsilon_r$) that usually means a ratio of the permittivity ($\epsilon$) of the dielectric material to permittivity ($\epsilon_0$) of vacuum. The relative permittivity ($\epsilon_r$) is also referred to as a dielectric constant. Since the following permittivity does not represent absolute values, the above-described expressions may be used interchangeably.

In addition, a proportion of dielectric polarization may vary depending on the direction of an applied electric field in relation to the molecular structure of the dielectric material. In a dielectric material having paraelectric properties, the dielectric polarization is generated in proportion to an electric field E. A thin film including a dielectric material having paraelectric characteristics may be employed in various fields, such as a dynamic random access memory (DRAM) element and a capacitor.

A high-k dielectric thin film needs to be formed to increase the degree of integration of a semiconductor device in which the electronic devices are employed, For example, $HfO_2$, $ZrO_2$, or a mixture thereof has a relatively stable monoclinic phase, which makes it difficult to crystallize into orthorhombic/tetragonal phases, and thus, there is a need for a method of stabilizing dielectric oxides into the orthorhombic/tetragonal phases. In addition, in order to meet demand for a design rule for increasing the degree of integration of the semiconductor device, there is a need for a structural method of crystallizing $HfO_2$, $ZrO_2$, or a mixture thereof into a tetragonal system to obtain a dielectric film with high permittivity, for example, even at a thickness less than or equal to 5 nm.

According to the thin film structure and the method of manufacturing the same of the embodiments, a dielectric material layer having high permittivity even at a thickness less than or equal to 5 nm by using an indium oxide-based seed material layer may be obtained.

Figure 1:
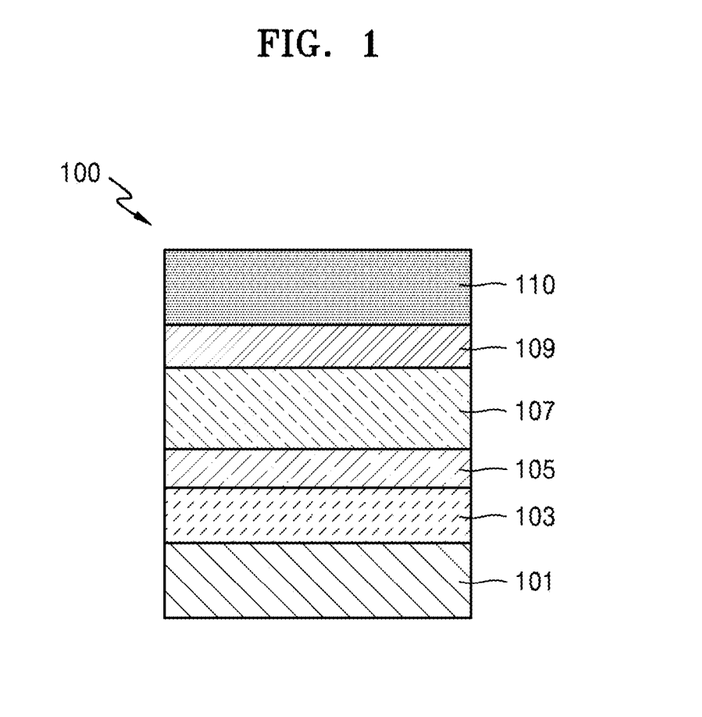
FIGS. 1 and 2 are cross-sectional views schematically illustrating a thin film structure including a dielectric material layer according to embodiments.
Figure 2:
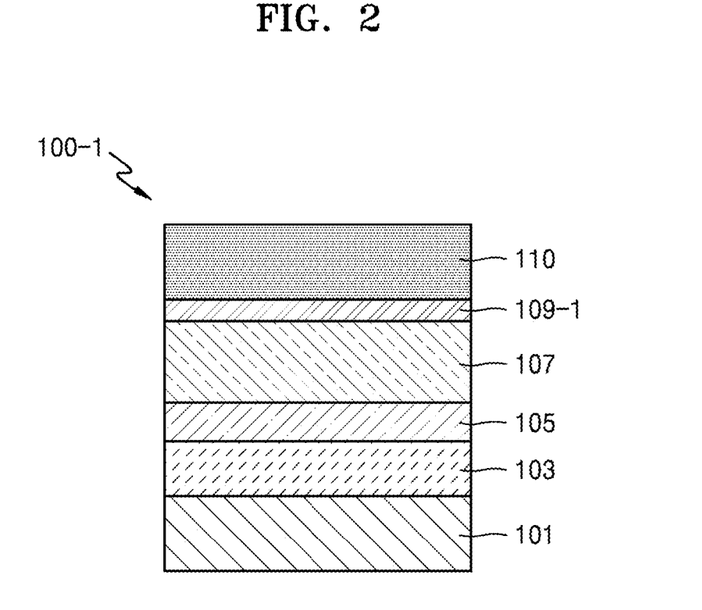

FIGS. 1 and 2 are cross-sectional views schematically illustrating a thin film structure 100 and 100-1 including a dielectric material layer according to embodiments.

Referring to FIGS. 1 and 2, each of the thin film structures 100 and 100-1 according to the embodiments may include a first conductive layer 103, a first dielectric material layer 107 including a metal oxide, an indium oxide-based seed material layer 109 or 109-1, and a second conductive layer 110, which are sequentially stacked on a base layer 101. The thin film structure 100 may further include a second dielectric material layer 105 between the first conductive layer 103 and the first dielectric material layer 107.

The base layer 101 may include a substrate such as a semiconductor substrate or an insulating substrate. For example, various semiconductor substrates, such as a silicon substrate, a silicon carbide substrate, a germanium substrate, and a silicon-germanium substrate, may be used as the base layer 101. In addition, an insulating substrate such as a sapphire substrate may be employed as the base layer 101. In addition to the substrate such as the semiconductor substrate or the insulating substrate, the base layer 101 may further include various structures of an electronic device in which the thin film structure 100 according to the embodiment is employed. In addition, the base layer 101 may further include an insulating layer on the substrate. The insulating layer may be a layer for suppressing or preventing electrical leakage. A silicon oxide, an aluminum oxide, a hafnium oxide, a zirconium oxide, a two-dimensional insulator, or the like may be used as the insulating layer. Material such as hexagonal boron nitride (h-BN) may be used as the two-dimensional insulator. However, the material of the insulating layer is not limited thereto.

The first conductive layer 103 may be formed of an electrode material employed in a semiconductor device. For example, the first conductive layer 103 may include TiN. In addition, the first conductive layer 103 may include a metal (e.g., W, Mo, Ni, Cu, and so on), a conductive oxide (e.g., $RuO_2$, $SrRuO_3$, ITO, and so on), a 2D material (e.g., graphene), a metal nitride, a metal oxynitride, polysilicon, or a combination thereof.

In the thin film structure 100 according to an embodiment, the first dielectric material layer 107 may have a crystal phase and may be formed to include a metal oxide having dielectric properties. For example, the first dielectric material layer 107 may include $HfO_2$, $ZrO_2$, $Al_2O_3$, and/or a mixture thereof. The first dielectric material layer 107 may be formed to have a thickness less than or equal to, for example, approximately 5 nm and may be formed to have a predetermined crystal phase, for example, a tetragonal crystal phase, to have high permittivity characteristics. In addition, the first dielectric material layer 107 may be formed to have paraelectric properties.

Deposition methods such as atomic layer deposition (ALD), metal organic atomic layer deposition (MOALD), chemical vapor deposition (CVD), metal organic chemical vapor deposition (MOCVD), and physical vapor deposition (PVD) may be used to form the first dielectric material layer 107.

The second dielectric material layer 105 may be located under the first dielectric material layer 107 to promote crystallization of the first dielectric material layer 107 and may be formed, between the first conductive layer 103 and the first dielectric material layer 107, to include a metal oxide including a component different from a component of the first dielectric material layer 107. The second dielectric material layer 105 may be formed to be thinner than the first dielectric material layer 107.

The second dielectric material layer 105 may include a metal oxide including a component different from the component of the first dielectric material layer 107, for example, among $HfO_2$, $ZrO_2$, $Al_2O_3$, or a mixture thereof.

Deposition methods such as atomic layer deposition (ALD), metal organic atomic layer deposition (MOALD), chemical vapor deposition (CVD), metal organic chemical vapor deposition (MOCVD), and physical vapor deposition (PVD) may be used to form the second dielectric material layer 105. The same deposition method as the deposition method of the first dielectric material layer 107 may be used or a deposition method different from the deposition method of the first dielectric material layer 107 may be used to form the second dielectric material layer 105.

The seed material layer 109 may be formed on the first dielectric material layer 107 and may include an indium oxide based layer. The seed material layer 109 may be formed of, for example, ITO, IZO, and/or a mixture thereof.

In the thin film structure 100 according to the embodiment, the seed material layer 109 may be formed to have a thickness less than a thickness of the first dielectric material layer 107. For example, a thickness of the first dielectric material layer 107 may be formed to be less than or equal to approximately 5 nm, and a thickness of the seed material layer 109 may be formed to be less than or equal to approximately 1 nm.

In another embodiment, in order to make the seed material layer 109 thinner than the first dielectric material layer 107, the seed material layer 109 may be partially removed after the first dielectric material layer 107 is crystallized. For example, before the crystallization of the first dielectric material layer 107, the thickness of the seed material layer 109 may be unlimited compared to the thickness of the first dielectric material layer 107 within a range in which the crystallization of the first dielectric material layer 107 may be performed, and after the crystallization of the first dielectric material layer 107, the seed material layer 109 may be formed to have a thickness less than the thickness of the first dielectric material layer 107 by removing a partial thickness of the seed material layer 109-1.

For example, since an indium oxide-based seed material layer 109 may lower permittivity of the thin film structure 100, only the crystallization of the first dielectric material layer 107 may be assisted, and the permittivity of the thin film structure 100 may be prevented from being reduced due to the indium oxide-based seed material layer 109 by removing at least a partial thickness of the indium oxide-based seed material layer 109. Accordingly, while the first dielectric material layer 107 is formed to have a thickness less than or equal to approximately 5 nm, the first dielectric material layer 107 may be crystallized into a crystal phase, for example, a tetragonal crystal phase, with assistance of the second dielectric material layer 105 and the indium oxide-based seed material layer 109-1, and thus, the thin film structure 100 having a thin dielectric material layer and high permittivity characteristics may be implemented.

Here, the seed material layer 109 may also be formed to have a thickness less than the thickness of the first dielectric material layer 107, for example, a thickness less than or equal to 1 nm. In this case, a process of removing a partial thickness of the seed material layer 109 after crystallization of the first dielectric material layer 107 may be omitted.

FIGS. 1 and 2 illustrate embodiments of the thin film structures 100 and 100-1 of the seed material layers 109 and 109-1 having different thicknesses, and FIG. 2 illustrates a case in which the seed material layer 109-1 is thinner than the seed material layer 109 of FIG. 1. When a thickness of the seed material layer 109 of FIG. 1 is referred to as a first thickness, the seed material layer 109 of FIG. 2 has a second thickness formed by removing a partial thickness of the seed material layer 109 of FIG. 1. Here, the seed material layer 109 may have the first thickness during a process of manufacturing the thin film structure 100 according to the embodiment, and the seed material layer 109-1 of the manufactured thin film structure 100-1 may have the second thickness formed by removing a partial thickness thereof. As such, the seed material layer 109 may be formed in a thickness range that may help crystallization of the first dielectric material layer 107, and after the first dielectric material layer 107 is crystallized, at least a partial thickness of the seed material layer 109 may be removed.

As another example, in FIG. 1, the first thickness of the seed material layer 109 may correspond to a thickness less than the thickness of the first dielectric material layer 107. Herein, the first thickness of the seed material layer 109 may be a thickness capable of preventing the permittivity from being reduced within a range that may help crystallization of the first dielectric material layer 107, and in this case, the process of removing a partial thickness of the seed material layer 109 may be omitted.

The second conductive layer 110 may be formed of an electrode material employed in a semiconductor device, and may be the same or a different material from the first conductive layer 103. For example, the second conductive layer 110 may include TiN. In addition, the second conductive layer 110 may include a metal (e.g., W, Mo, Ni, Cu, and so on), a conductive oxide (e.g., $RuO_2$, $SrRuO_3$, ITO, and so on), a 2D material (e.g., graphene), a metal nitride, a metal oxynitride, polysilicon, or a mixture thereof.

FIGS. 3A to 3H schematically illustrate a process of manufacturing the thin film structure 100 according to the embodiment.

Figure 3A:
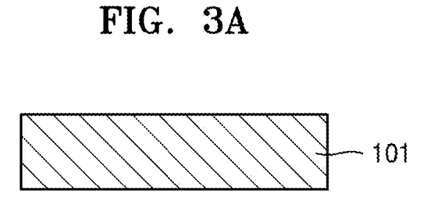
FIGS. 3A to 3H schematically illustrate a process of manufacturing the thin film structure, according to the embodiment.

First, the base layer 101 is prepared to form the thin film structure 100 as illustrated in FIG. 3A. The base layer 101 may be provided with a substrate such as a semiconductor substrate or an insulating substrate. In addition, an insulating layer may be further formed on the substrate. For example, various semiconductor substrates, such as a silicon substrate, a silicon carbide substrate, a germanium substrate, and a silicon-germanium substrate, may be employed as the base layer 101. In addition, an insulating substrate such as a sapphire substrate may be employed as the base layer 101. In addition to the substrate such as the semiconductor substrate or the insulating substrate, the base layer 101 may further include various structures of an electronic device in which the thin film structure 100 according to the embodiment is employed. In addition, the base layer 101 may further include an insulating layer provided on the substrate. Here, the insulating layer may be a layer for suppressing or preventing electrical leakage. A silicon oxide, an aluminum oxide, a hafnium oxide, a zirconium oxide, a two-dimensional insulator, or the like may be used as the insulating layer. Materials such as hexagonal boron nitride may be used as the two-dimensional insulator. However, the insulating layer material is not limited thereto. Various structures of an electronic device in which the thin film structure 100 is employed may be further included on the base layer 101.

Figure 3B:
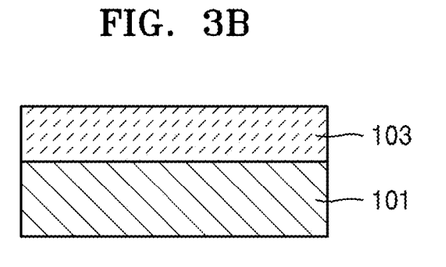

Next, as illustrated in FIG. 3B, the first conductive layer 103 may be formed on the base layer 101. The first conductive layer 103 may be formed of an electrode material employed in a semiconductor device. For example, the first conductive layer 103 may include TiN. In addition, the first conductive layer 103 may include a metal (e.g., W, Mo, Ni, Cu, and so on), a conductive oxide (e.g., $RuO_2$, $SrRuO_3$, ITO, and so on), a 2D material (e.g., graphene), a metal nitride, a metal oxynitride, polysilicon, or a combination thereof. The first conductive layer 103 may have a multi-layer structure of conductive layers formed of different electrode materials.

Figure 3C:
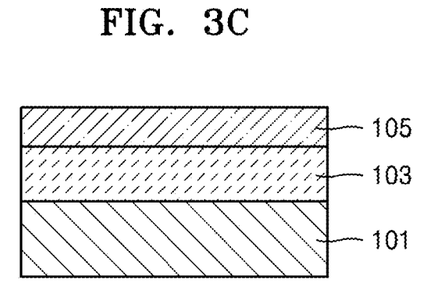
Figure 3D:
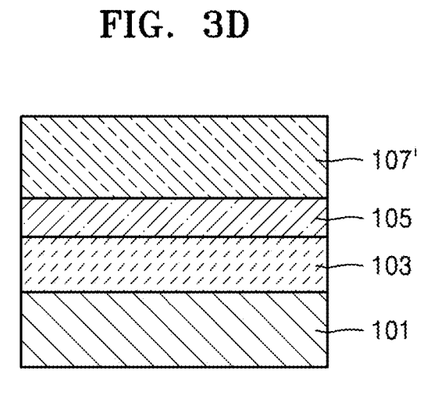

Next, a first precursor dielectric material layer 107' including a metal oxide having dielectric properties may be formed on the first conductive layer 103. When the thin film structure 100 according to an embodiment further includes the second dielectric material layer 105, prior to the formation of the first precursor dielectric material layer 107', a second dielectric material layer 105 that includes a metal oxide including a metal component different from the component of the first precursor dielectric material layer 107' and which may promote the crystallization of the first precursor dielectric material layer 107' may be formed on the first conductive layer 103 as illustrated in FIG. 3C. As illustrated in FIG. 3D, the first precursor dielectric material layer 107' may be formed on the second dielectric material layer 105. In this case, the first precursor dielectric material layer 107' may be formed on the second dielectric material layer 105, and the second dielectric material layer 105 may be located between the first conductive layer 103 and the first precursor dielectric material layer 107'. Here, the second dielectric material layer 105 may have a thickness less than the thickness of the first precursor dielectric material layer 107'.

According to a method of manufacturing the thin film structure 100 according to the embodiment, the first precursor dielectric material layer 107' may be directly formed on the first conductive layer 103 without forming the second dielectric material layer 105, for example, when the first conductive layer 103 is an indium oxide compound like ITO or IZO. However, as illustrated in FIGS. 3C and 3D, according to another embodiment of the method of manufacturing the thin film structure 100, the first precursor dielectric material layer 107' may be directly formed on a second dielectric material layer 105. Hereinafter, a case where the second dielectric material layer 105 is formed on the first conductive layer 103 and the first precursor dielectric material layer 107' is formed on the second dielectric material layer 105 will be described as an example.

Deposition methods such as atomic layer deposition (ALD), metal organic atomic layer deposition (MOALD), chemical vapor deposition (CVD), metal organic chemical vapor deposition (MOCVD), and physical vapor deposition (PVD) may be used to form the first dielectric material layer 107 and the second dielectric material layer 105. The same deposition method or different deposition methods may be used from each other may be used to form the first dielectric material layer 107 and the second dielectric material layer 105.

The first precursor dielectric material layer 107' may be formed to include a metal oxide having a crystal phase and having dielectric properties. For example, the first precursor dielectric material layer 107' may be formed to include $HfO_2$, $ZrO_2$, $Al_2O_3$, or a mixture thereof. The first precursor dielectric material layer 107' may be formed to have a thickness less than or equal to, for example, approximately 5 nm. The first precursor dielectric material layer 107' may be processed to form a first dielectric material layer 107. The first dielectric material layer 107 may have a crystal phase, for example, a tetragonal crystal phase, through the subsequent crystallization process. In addition, the first dielectric material layer 107 may have paraelectric properties through the crystallization process.

The second dielectric material layer 105 may be formed below the first precursor dielectric material layer 107' and may promote the crystallization of the first dielectric material layer 107. The second dielectric material layer 105 may be formed of a metal oxide including a component different from a component of the first dielectric material layer 107. The second dielectric material layer 105 may be formed of a metal oxide including a metal component different from the metal component of the first dielectric material layer 107. For example, in an example embodiment in which the first dielectric material layer 107 includes $HfO_2$, the second dielectric material layer 104 may include a metal oxide including a metal component different from hafnium, for example, an oxide among $ZrO_2$. $Al_2O_3$, and/or a mixture thereof.

Figure 3E:
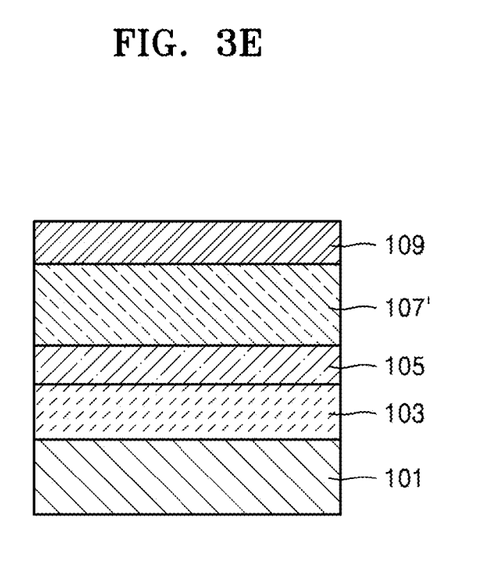

After the second dielectric material layer 105 and the first precursor dielectric material layer 107' are formed, the seed material layer 109 may be formed on the first precursor dielectric material layer 107' to have a first thickness, as illustrated in FIG. 3E. The seed material layer 109 may include an indium oxide-based layer. The seed material layer 109 may be formed of any one of, for example, indium tin oxide (ITO) and indium zinc oxide (IZO). The seed material layer 109 may be formed by using a deposition method such as atomic layer deposition (ALD) or physical vapor deposition (PVD).

Figure 3F:
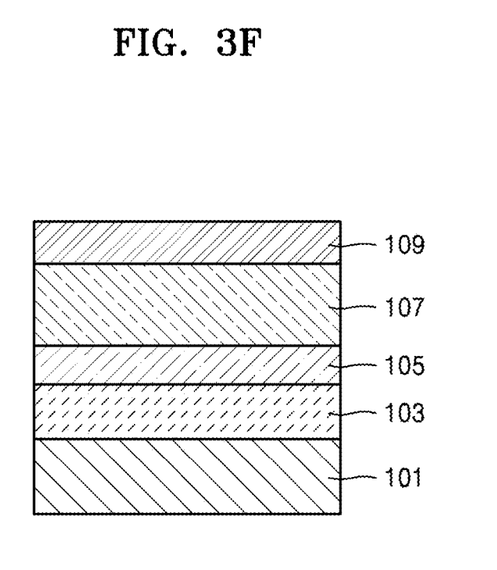

Next, as illustrated in FIG. 3F, a stacked structure of the thin film structure 100 formed up to the seed material layer 109 may be heat-treated. A heat treatment temperature in a heat treatment process may be a temperature range applicable to a semiconductor device, for example, 400° C. to 600° C. The first precursor dielectric material layer 107' may be crystallized through the heat treatment process to form the first dielectric material layer 107. During the heat treatment process, the first precursor dielectric material layer 107' may be crystallized into a crystal phase, for example, a tetragonal crystal phase by the second dielectric material layer 105 under the first precursor dielectric material layer 107' and the seed material layer 109 on the first precursor dielectric material layer 107'.

Figure 3G:
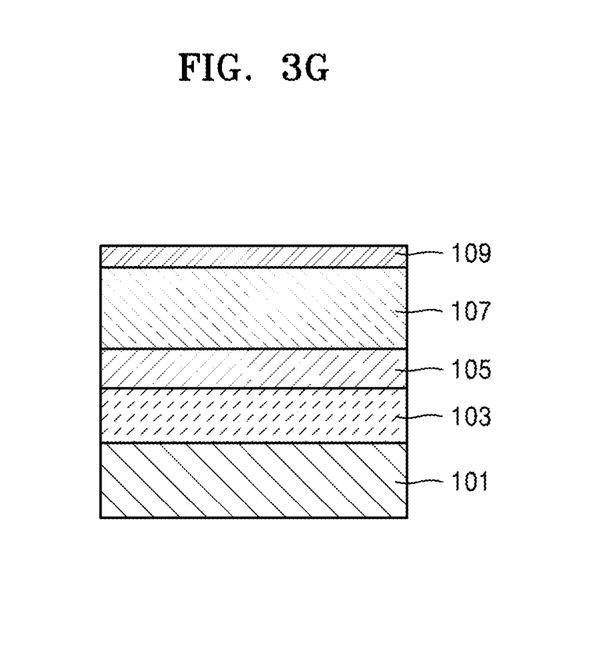

Next, as illustrated in FIG. 3G, at least a partial thickness of the seed material layer 109 may be removed after the heat treatment. The seed material layer 109-1 having a second thickness less than the first thickness may be left after removing a partial thickness of the seed material layer 109 having the first thickness. As a result, the seed material layer 109-1 may be formed to have a thickness less than the thickness of the first dielectric material layer 107. For example, when the first dielectric material layer 107 is formed to have a thickness less than or equal to approximately 5 nm, the seed material layer 109-1 left by removing a partial thickness may have a thickness less than or equal to approximately 1 nm. Here, the seed material layer 109-1 may be removed such that there is no physical thickness.

As such, a partial thickness of the seed material layer 109 may be removed after crystallization of the first dielectric material layer 107 such that the seed material layer 109-1 has the thickness less than the first dielectric material layer 107. At this time, before crystallization of the first dielectric material layer 107, the thickness of the seed material layer 109 may be unlimited compared to the thickness of the first dielectric material layer 107 within a range capable of promoting crystallization of the first dielectric material layer 107 during the heat treatment process, and after the crystallization, a partial thickness of the seed material layer 109 may be removed to have a thickness less than the thickness of the first dielectric material layer 107.

Since the indium oxide-based seed material layer 109 may reduce permittivity of the thin film structure 100, only the crystallization of the first dielectric material layer 107, for example, the crystallization of $HfO_2$, is assisted and by removing at least a partial thicknesses thereof, the permittivity of the thin film structure 100 due to the indium oxide-based seed material layer 109 may be prevented from being reduced.

Alternatively, the seed material layer 109 may be formed to initially have a thickness, which is less than the thickness of the first dielectric material layer 107, such as approximately 1 nm. That is, the seed material layer 109 may be formed to have a thickness within a range that does not reduce the permittivity of the thin film structure 100 while the first thickness of the seed material layer 109 corresponds to a thickness less than the thickness of the first dielectric material layer 107 assisting to crystallize the first dielectric material layer 107 having a thickness less than or equal to, for example, approximately 5 nm. In this case, the process of removing a partial thickness of the seed material layer 109 after crystallization of the first dielectric material layer 107, as illustrated in FIG. 3G, may be omitted.

Figure 3H:
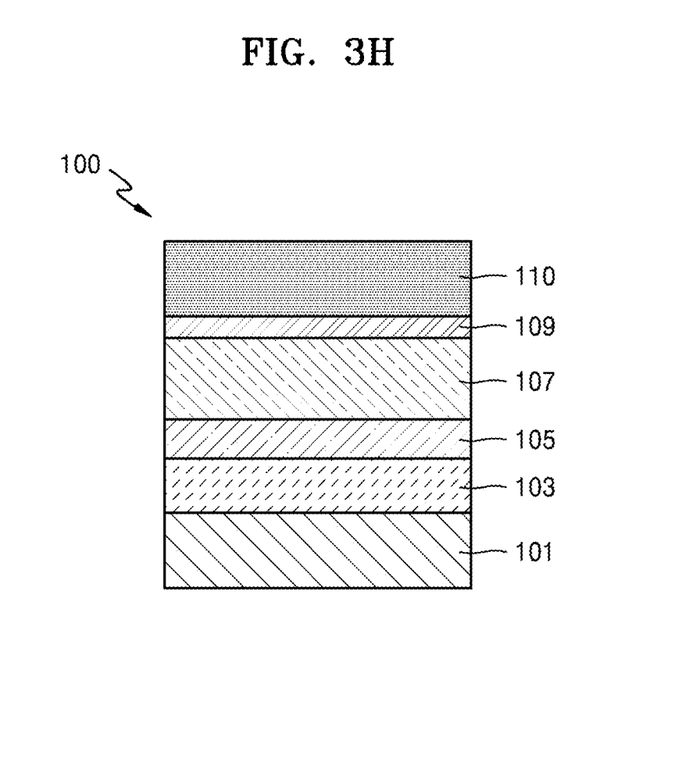

Next, as illustrated in FIG. 3H, the second conductive layer 110 may be formed on the seed material layer 109. The second conductive layer 110 may be formed of an electrode material employed in a semiconductor device. For example, the second conductive layer 110 may include TiN. In addition, the second conductive layer 110 may include a metal (e.g., W, Mo, Ni, Cu, and so on), a conductive oxide (e.g., $RuO_2$, $SrRuO_3$, ITO, and so on), a 2D material (e.g., graphene), a metal nitride, a metal oxynitride, polysilicon, or a mixture thereof.

As described above, by placing the second dielectric material layer 105, which is well crystallized in a lower portion of the first dielectric material layer 107, and placing the indium oxide-based seed material layer 109 in an upper portion thereof, the first dielectric material layer 107 may have a predetermined crystal phase, for example, a tetragonal crystal phase, induced by upper and lower layers during the heat treatment process.

According to the thin film structures 100-1 manufactured as described above, the thin film structures having high permittivity may be implemented by forming the first dielectric material layer 107, which has a thickness less than or equal to 5 nm and is crystallized into a predetermined crystal phase, for example, a tetragonal crystal phase.

In the above description, although a case where the thin film structures 100 according to the embodiments include a stacked structure of the first conductive layer 103, the second dielectric material layer 105, the first dielectric material layer 107, the indium oxide-based seed material layer 109, and the second conductive layer 110 is described and illustrated by way of examples, the embodiments are not limited thereto, and a structure without the second dielectric material layer 105 may be possible.

Therefore, the thin film structures 100 according to the embodiments may have high permittivity because the first dielectric material layer 107 may be formed to have a thickness less than or equal to approximately 5 nm and the first dielectric material layer 107 may be crystallized into a crystal phase, for example, a tetragonal crystal phase.

An electronic device in which the thin film structure 100 according to the embodiment is employed may be implemented as a capacitor, a transistor, etc. For example, when the electronic device employing the thin film structure 100 according to the embodiment is a capacitor, a MIM capacitor having high permittivity may be implemented, and thus, the electronic device may be implemented as a high permittivity capacitor of DRAM.

In addition, the electronic device having the thin film structure 100 may implemented as an integrated device. The integrated device may be implemented as a part of an integrated circuit formed on a silicon base, and the integrated circuit may include a plurality of capacitors, transistors, memory elements, and so on. As the device includes a dielectric material layer having high permittivity characteristics, desired high performance and miniaturization may be implemented.

Figure 4A:
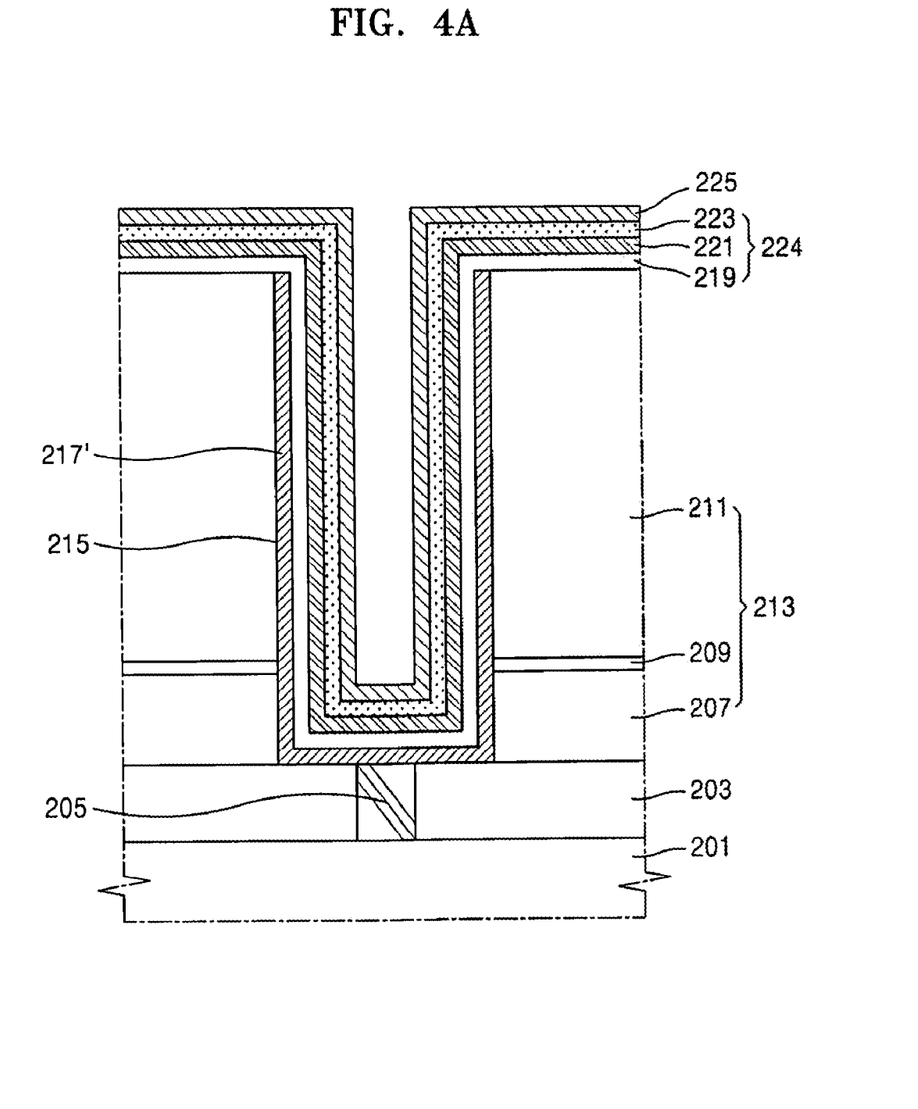
FIG. 4A is a cross-sectional view illustrating a structure of a metal-insulator-metal (MIM) capacitor according to an embodiment.

FIG. 4A illustrates a structure of a metal-insulator-metal (MIM) capacitor according to an embodiment.

An interlayer insulating film 203 may be stacked on a semiconductor substrate 201. A contact plug 205 may be formed to fill a contact hole through which the semiconductor substrate 201 is exposed. A mold insulating film 213 may be formed on the semiconductor substrate having the contact plug 205. As illustrated in FIG. 4A, the mold insulating film 213 may have a structure in which a lower mold insulating film 207, an etch stop film 209, and an upper mold insulating film 211 are sequentially stacked on the semiconductor substrate having the contact plug 205. However, the example embodiments are not so limited, for example the etch stop film 209 may be formed directly on an upper surface of the contact plug 205 and the interlayer insulating film 203. In other embodiments, the mold insulating film 213 may be formed as a double-layered mold insulating film including the lower mold insulating film 207 and the upper mold insulating film 211, or as a single mold insulating film. The lower mold insulating film 207 and the upper mold insulating film 211 may have an etch selectivity with respect to the etch stop film 209. For example, when the lower mold insulating film 207 and the upper mold insulating film 211 are formed of a silicon oxide film, the etch stop film 209 may be formed of a silicon nitride film. A storage node hole 215 which exposes the upper surface of the contact plug 205 and the upper surface of the interlayer insulating film 203 adjacent to the contact plug 205 may be formed by patterning the mold insulating film 213.

A conductive film may be formed on the entire surface of the semiconductor substrate having the storage node hole 215. The conductive film may be formed as a conductive film having excellent step coverage, resistance to deformation during a subsequent dielectric film forming process, and resistance to oxidation. The conductive film may be etched to be isolated in the storage node hole 150, forming a lower electrode 217'.

A buffer insulating film (not illustrated) may also be formed on the lower electrode conductive film. The lower electrode 217' isolated in the storage node hole 215, and a buffer insulating film pattern isolated in the storage node hole 215 may be formed. The buffer insulating film pattern may be selectively removed to have a structure exposing the inner wall of the lower electrode. A dielectric film 224 in which a lower dielectric film 219 and an upper dielectric film 223 are sequentially stacked on the entire surface of the semiconductor substrate 201 having the lower electrode 217' may be formed. An intermediate dielectric film 221 may be interposed between the lower dielectric film 219 and the upper dielectric film 223. The lower dielectric film 219, the intermediate dielectric film 221, and the upper dielectric film 223 may be the dielectric and seed material layers according to an example embodiment. An upper electrode 225 may be formed on the upper dielectric film 223.

The MIM capacitor of FIG. 4A may have a concave structure or a cylindrical structure.

Figure 4B:
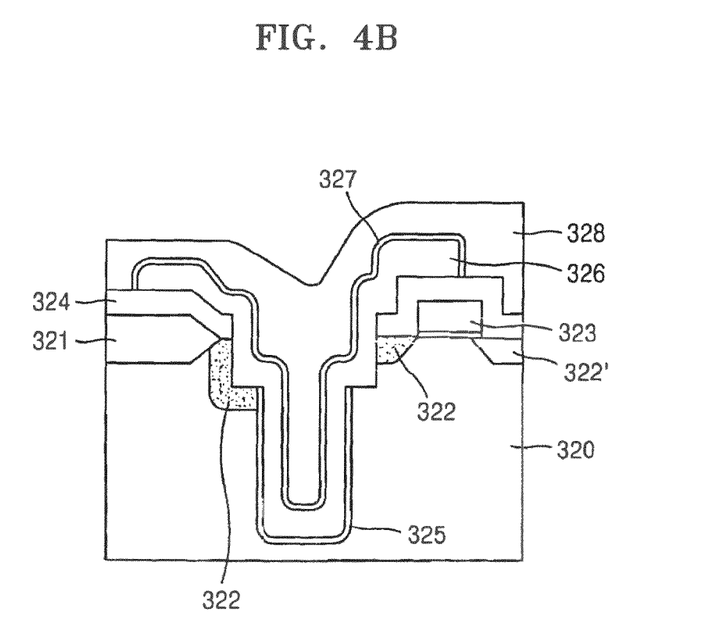
FIG. 4B illustrates a structure of a trench capacitor-type dynamic random-access memory (DRAM) according to an embodiment.

FIG. 4B illustrates a structure of a trench capacitor-type dynamic random access memory (DRAM).

Referring to FIG. 4B, on a P-type semiconductor substrate 320, a device isolation region may be defined with a field oxide film 321, and a gate electrode 323 and source/drain impurity regions 322 and 322' may be formed in the device isolation region. A high-temperature oxide (HTO) film may be formed as an interlayer insulating film 324. A region not to be a trench may be capped with a trench buffer layer, and a part of the source region 322 may be open to form a contact portion.

A trench is formed in a sidewall of the interlayer insulating film 324, and a sidewall oxide film 325 may be formed over the entire sidewall of the trench. The sidewall oxide film 325 may compensate for damage in the semiconductor substrate caused by etching to form the trench, and may also serve as a dielectric film between the semiconductor substrate 320 and a storage electrode 326. A sidewall portion of part of the source region 322, except for the other part of the source region near the gate electrode 323, may be entirely exposed.

A PN junction (not illustrated) may be formed in the sidewall portion of the source region by impurity implantation. The trench may be formed in the source region 322. A sidewall of the trench near the gate may directly contact the source region 322, and the PN junction may be formed by additional impurity implantation into the source region.

A storage electrode 326 may be formed on part of the interlayer insulating film 324, the exposed source region, and the surface of the sidewall oxide film 325 in the trench. The storage electrode may be, for example, a polysilicon layer, and may be formed so as to contact the entire source region 322 in contact with the upper sidewall of the trench, in addition to the part of the source region 322 near the gate electrode. The source region 322 on the outer surface of the upper sidewall of the trench may be enlarged due to the implanted impurities, and thus may more reliably contact the storage electrode 326. Next, an insulating film 327 as a capacity dielectric film may be formed along the upper surface of the storage electrode 326, and a polysilicon layer as a plate electrode 328 may be formed thereon, thereby completing a trench capacitor type DRAM. The dielectric material layers and seed material layer according to any of the embodiments may be used as the insulating film 327, wherein the storage electrode 326 and the plate electrode 328 are the first and second conductive layers, respectively.

As the storage electrode 326, the polysilicon layer may be formed on the part of the interlayer insulating film 324, the exposed source region 322, and the surface of the sidewall oxide film 325 in the trench. Since the storage electrode 326 is formed to spontaneously contact, in addition to the part of the source region 322 near the gate electrode, the entire source region 322 in contact with the upper sidewall of the trench, the contact area may be enlarged, leading to more reliable contact with the storage electrode 326 and a significant increase in capacitance of the capacitor.

Although the thin film structure, the method of manufacturing the same, and the electronic device which are described above are described with reference to the embodiments illustrated in the drawings, these are merely example, and those skilled in the art may understand that various modifications and equivalent embodiments may be made therefrom. While many details are set forth in the foregoing description, those should be construed as illustrations of specific embodiments rather than to limit the scope of the disclosure. Therefore, the scope of the present disclosure should not be determined by the described embodiments, but by the technical idea described in the claims.

According to the embodiments, by employing an indium oxide-based seed material layer on a dielectric material layer, a thin film structure including the dielectric material layer having a thickness less than or equal to approximately 5 nm and having high permittivity characteristics, a method of manufacturing the thin film structure, and an electronic device including the same may be implemented.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A thin film structure comprising:
a first conductive layer;
a first dielectric material layer on the first conductive layer, the first dielectric material layer having a tetragonal crystal phase and including a metal oxide;
an indium oxide-based seed material layer on the first dielectric material layer, the indium oxide-based seed material layer having a thickness less than a thickness of the first dielectric material layer and configured to induce the tetragonal crystal phase of the first dielectric material layer; and
a second conductive layer formed on the seed material layer, the second conductive layer including a conductive material different from the indium oxide-based seed material.

2. The thin film structure of claim 1, wherein the first dielectric material layer comprises at least one of $HfO_2$, $ZrO_2$, and $Al_2O_3$.

3. The thin film structure of claim 1, wherein the thickness of the first dielectric material layer is less than or equal to approximately 5 nm.

4. The thin film structure of claim 1, wherein the first dielectric material layer has paraelectric characteristics.

5. The thin film structure of claim 1, further comprising a second dielectric material layer including a metal oxide including a component different from a component of the first dielectric material layer, the second dielectric material layer between the first conductive layer and the first dielectric material layer and configured to promote crystallization of the first dielectric material layer.

6. The thin film structure of claim 5, wherein the first dielectric material layer comprises at least one of $HfO_2$, $ZrO_2$, and $Al_2O_3$, and the second dielectric material layer comprises a metal oxide including a component different from a component of the first dielectric material layer among $HfO_2$, $ZrO_2$, $Al_2O_3$, or a mixture thereof.

7. The thin film structure of claim 1, wherein the indium oxide-based seed material layer comprises at least one of ITO and IZO.

8. The thin film structure of claim 7, wherein the thickness of the indium oxide-based seed material layer is less than or equal to approximately 1 nm.

9. A method of manufacturing the thin film structure of claim 1, the method comprising:
preparing a base layer;
forming a first conductive layer on the base layer;
forming a first dielectric material layer on the first conductive layer, the first dielectric material layer comprising a metal oxide;
forming an indium oxide-based seed material layer on the first dielectric material layer, the seed material layer having a first thickness;
heat treating the first dielectric material layer after forming the seed material layer; and
forming a second conductive layer on the seed material layer after the heat treating.

10. The method of claim 9, further comprising:
removing a partial thickness of the seed material layer after the heat treating such that the seed material layer has a second thickness less than the first thickness before forming the second conductive layer.

11. The method of claim 10, wherein the second thickness of the seed material layer is less than or equal to approximately 1 nm.

12. The method of claim 9, further comprising:
forming a second dielectric material layer on the first conductive layer, the second dielectric material layer comprising a metal oxide, the metal oxide including a component different from a component of the first dielectric material layer and configured to promote crystallization of the first dielectric material layer before the forming the first dielectric material layer,
wherein the first dielectric material layer is formed on the second dielectric material layer.

13. The method of claim 12, wherein
the first dielectric material layer comprises at least one of $HfO_2$, $ZrO_2$, and $Al_2O_3$, and
wherein the second dielectric material layer comprises a metal oxide including a component different from a component of the first dielectric material layer among the at least one of the $HfO_2$, the $ZrO_2$, and the $Al_2O_3$.

14. The method of claim 9, wherein the first dielectric material layer comprises at least one of $HfO_2$, $ZrO_2$, and $Al_2O_3$.

15. The method of claim 9, wherein the first dielectric material layer is formed to have a thickness less than or equal to approximately 5 nm.

16. The method of claim 9, wherein the first dielectric material layer comprises a tetragonal crystal phase.

17. The method of claim 9, wherein the first dielectric material layer has paraelectric characteristics.

18. The method of claim 9, wherein the seed material layer comprises at least one of ITO and IZO.

19. An electronic device comprising:
a base layer; and
the thin film structure of claim 1 on the base layer.

* * * * *